United States Patent
Kwon et al.

(10) Patent No.: US 12,466,024 B2
(45) Date of Patent: Nov. 11, 2025

(54) SEMICONDUCTOR SUBSTRATE GRINDING APPARATUS FOR SIMULTANEOUS GRINDING AND POLISHING OF BACKSIDE OF WAFER

(71) Applicant: SAMSUNG ELECTRONICS CO., LTD., Suwon-si (KR)

(72) Inventors: Donghoon Kwon, Suwon-si (KR); Hyojung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 299 days.

(21) Appl. No.: 18/083,007

(22) Filed: Dec. 16, 2022

(65) Prior Publication Data

US 2023/0373058 A1    Nov. 23, 2023

(30) Foreign Application Priority Data

May 23, 2022 (KR) .................. 10-2022-0062907

(51) Int. Cl.
*B24B 37/34* (2012.01)
*B08B 3/02* (2006.01)
(Continued)

(52) U.S. Cl.
CPC .............. *B24B 37/34* (2013.01); *B08B 3/022* (2013.01); *B24B 7/228* (2013.01); *B24B 37/107* (2013.01);
(Continued)

(58) Field of Classification Search
CPC . H01L 21/02016; H01L 21/304; B24B 37/34; B24B 37/107; B24B 37/04; B24B 37/08; B24B 7/228
See application file for complete search history.

(56) References Cited

U.S. PATENT DOCUMENTS 4,016,855 A    4/1977  Mimata
2010/0285723 A1*  11/2010  Lin ....................... B24B 57/02
                                                   451/36
(Continued)

FOREIGN PATENT DOCUMENTS

CN    102067216 A  *  5/2011  ........... B24B 37/015
CN    111785611 A  *  10/2020
(Continued)

*Primary Examiner* — C. A. Rivera
(74) *Attorney, Agent, or Firm* — Sughrue Mion, PLLC (57) ABSTRACT

A semiconductor substrate grinding apparatus including a chuck table configured to mount and fix a semiconductor substrate, so that a back side of the semiconductor substrate faces upwardly and rotates in one direction; a grinding wheel on the chuck table configured to grind the back side of the semiconductor substrate; a cleaning liquid supplier on the chuck table, spaced apart from the grinding wheel, and configured to supply a cleaning liquid to the back side of the semiconductor substrate for cleaning by-products generated by grinding the semiconductor substrate; a slurry supplier on the chuck table, adjacent to the cleaning liquid supplier, and configured to supply a slurry to the back side of the semiconductor substrate; and a polishing wheel on the chuck table, spaced apart from the slurry supplier, and configured to perform chemical mechanical polishing on the back side of the semiconductor substrate using the slurry.

22 Claims, 7 Drawing Sheets

(51) Int. Cl.
  *B24B 7/22*    (2006.01)
  *B24B 37/10*   (2012.01)
  *H01L 21/02*   (2006.01)
  *H01L 21/67*   (2006.01)
  *H01L 21/687*  (2006.01)

(52) U.S. Cl.
  CPC .. *H01L 21/02016* (2013.01); *H01L 21/67051* (2013.01); *H01L 21/68764* (2013.01)

(56)           References Cited

U.S. PATENT DOCUMENTS

2018/0021919 A1*  1/2018  Lehner .................... B24B 51/00
                                                      438/464
2020/0391337 A1   12/2020  Tabuchi et al.
2021/0154794 A1   5/2021   Kim

FOREIGN PATENT DOCUMENTS

| | | | |
|---|---|---|---|
| JP | 2020-203336 A | | 12/2020 |
| JP | 2021-82780 A | | 5/2021 |
| KR | 10-2005-0042511 A | | 5/2005 |
| KR | 10-2006-0089801 A | | 8/2006 |
| KR | 10-2007-0049349 A | | 5/2007 |
| KR | 10-2007-0112561 A | | 11/2007 |
| KR | 10-2009-0013406 A | | 2/2009 |
| KR | 10-0918069 B1 | | 9/2009 |
| KR | 20110119382 A | * | 11/2011 |
| TW | 426582 B1 | * | 2/2014 ........... H01L 21/481 |

* cited by examiner

SEMICONDUCTOR SUBSTRATE GRINDING APPARATUS FOR SIMULTANEOUS GRINDING AND POLISHING OF BACKSIDE OF WAFER

CROSS-REFERENCE TO RELATED APPLICATION(S)

This application claims benefit of priority to Korean Patent Application No. 10-2022-0062907 filed on May 23, 2022 in the Korean Intellectual Property Office, the disclosure of which is incorporated by reference herein in its entirety.

BACKGROUND

1. Field

The disclosure relates to a semiconductor substrate grinding apparatus and a semiconductor substrate grinding method using the same.

2. Description of Related Art

In a wafer manufacturing operation of forming a semiconductor integrated circuit on a wafer, a thick wafer is provided in order to suppress damage to a wafer occurring during movement or handling of the wafer.

After the wafer manufacturing process, an operation of grinding a back side of the wafer is performed so that unnecessary portions of the wafer are removed. The grinding operation of the back side of the wafer reduces a volume of a semiconductor chip and makes it possible to secure good heat dissipation characteristics. However, in the process of grinding the back side of the wafer, cracks may occur in a surface of the wafer, and the cracks generated in the surface of the wafer may diffuse to a device layer of the wafer to damage the device layer or damage the wafer itself.

SUMMARY

According to an aspect of the disclosure, a semiconductor substrate grinding apparatus includes: a chuck table configured to mount a semiconductor substrate and fix the semiconductor substrate thereto, so that a back side of the semiconductor substrate faces upwardly and rotates in one direction; a grinding wheel on the chuck table, and configured to grind the back side of the semiconductor substrate; a cleaning liquid supplier on the chuck table, spaced apart from the grinding wheel in the one direction, and configured to supply a cleaning liquid to the back side of the semiconductor substrate for cleaning by-products generated by grinding the semiconductor substrate; a slurry supplier on the chuck table, adjacent to the cleaning liquid supplier in the one direction, and configured to supply a slurry to the back side of the semiconductor substrate; and a polishing wheel on the chuck table, spaced apart from the slurry supplier in the one direction, and configured to perform chemical mechanical polishing on the back side of the semiconductor substrate using the slurry.

According to an aspect of the disclosure, a semiconductor substrate grinding apparatus, includes: a chuck table configured to mount a semiconductor substrate and fix the semiconductor substrate thereto, so that a back side of the semiconductor substrate faces upwardly and rotates in one direction; a grinding wheel on the chuck table, and configured to grind the back side of the semiconductor substrate; a polishing wheel on the chuck table, spaced apart in the one direction and from the grinding wheel, and configured to polish the back side of the semiconductor substrate; a cleaning liquid supplier on the chuck table, between the grinding wheel and the polishing wheel based on the one direction, and configured to supply a cleaning liquid to the back side of the semiconductor substrate; and a slurry supplier on the chuck table, between the cleaning liquid supplier and the polishing wheel based on the one direction, and configured to supply a slurry to the back side of the semiconductor substrate.

According to an aspect of the disclosure, a semiconductor substrate grinding apparatus includes: a chuck table configured to mount a semiconductor substrate and fix the semiconductor substrate thereto, so that a back side of the semiconductor substrate faces upwardly and rotates in one direction; a grinding wheel on the chuck table, to overlap a first region of the semiconductor substrate, and configured to perform a first process of reducing a thickness of the semiconductor substrate by grinding the back side of the semiconductor substrate; and a polishing wheel on the chuck table, to overlap a second region of the semiconductor substrate, spaced apart from the first region of the semiconductor substrate, and configured to perform a second process of polishing the back side of the semiconductor substrate that is ground by the grinding wheel, where the grinding wheel and the polishing wheel are configured to simultaneously perform the first process and the second process, respectively.

According to an aspect of the disclosure, a semiconductor substrate grinding method includes: loading a semiconductor substrate on a chuck table, so that a back side of the semiconductor substrate faces upwardly; rotating the semiconductor substrate in a first direction; grinding a first region of the back side of the semiconductor substrate, polishing a second region of the semiconductor substrate, spaced apart from the first region, and sequentially spraying a cleaning liquid and a slurry between the first region and the second region based on the first direction; and unloading the semiconductor substrate from the chuck table.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the disclosure will be described with reference to the accompanying drawings.

Figure 1:
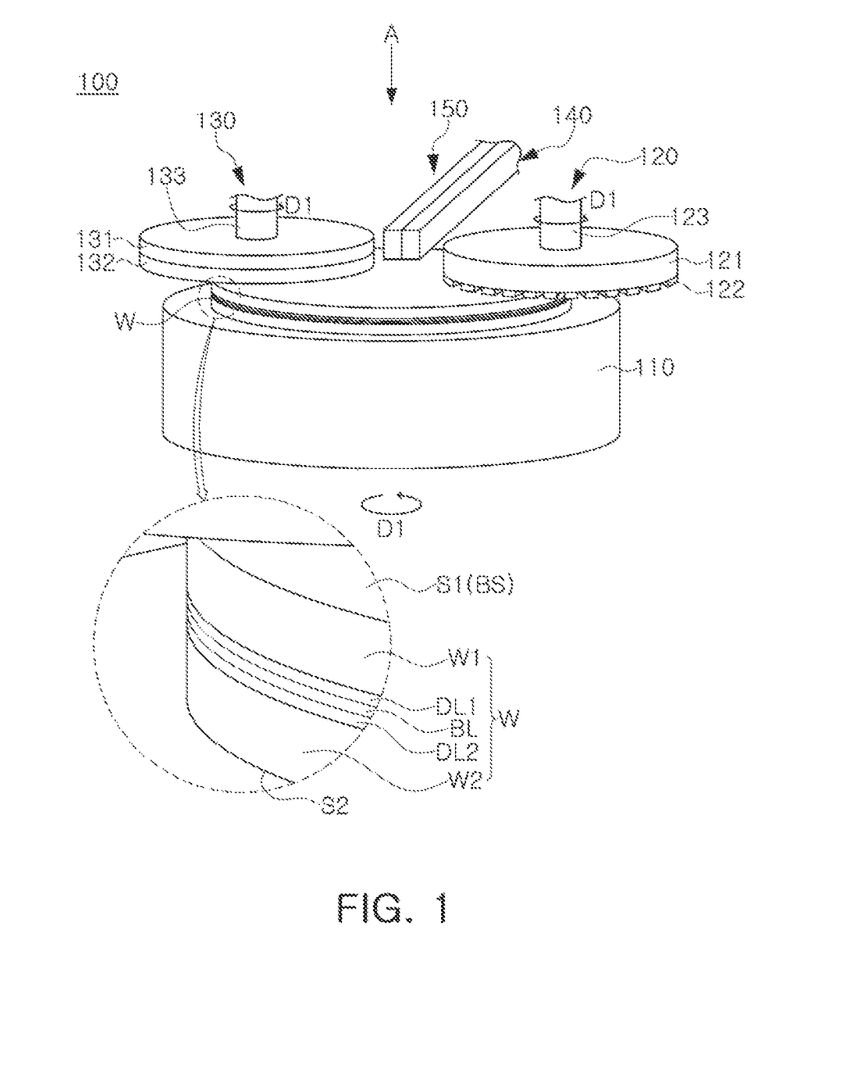
FIG. 1 is a schematic perspective view of a semiconductor substrate grinding apparatus according to an embodiment.
Figure 2A:
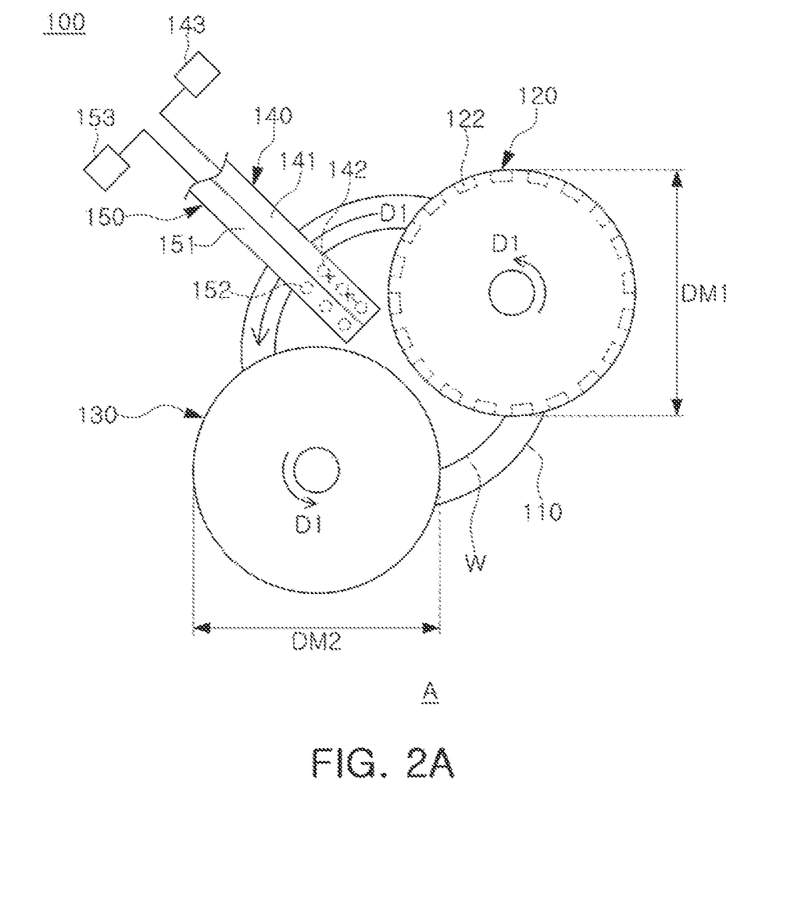
FIG. 2A is a plan view viewed from the direction 'A' of FIG. 1, according to an embodiment.
Figure 2B:
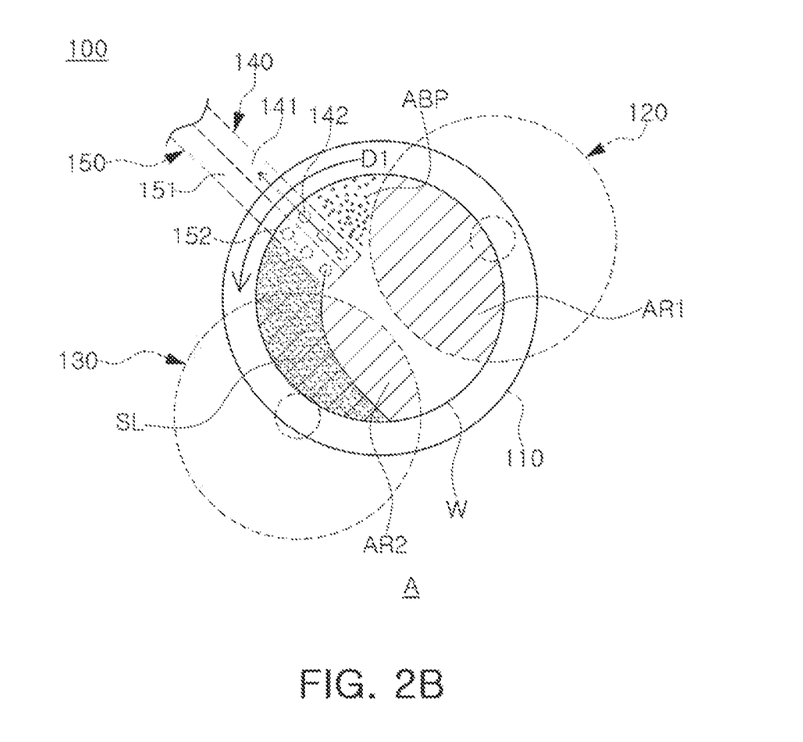
FIG. 2B is a diagram illustrating a distribution of a cleaning liquid and a slurry applied to the semiconductor substrate of FIG. 2A, according to an embodiment.

Referring to FIGS. 1, 2A, and 2B, a semiconductor substrate grinding apparatus will be described. FIG. 1 is a schematic perspective view of a semiconductor substrate grinding apparatus according to an embodiment; FIG. 2A is a plan view viewed from the direction 'A' of FIG. 1, according to an embodiment; and FIG. 2B is a diagram illustrating a distribution of a cleaning liquid and a slurry applied to the semiconductor substrate of FIG. 2A, according to an embodiment.

Referring to FIGS. 1 and 2A, in a semiconductor substrate grinding apparatus 100, a grinding wheel 120, a cleaning liquid supply unit 140, a slurry supply unit 150, and a polishing wheel 130 may be sequentially disposed in a rotational direction D1 of a chuck table 110 on the chuck table 110. The semiconductor substrate grinding apparatus 100 may be used to grind the semiconductor substrate W, such as a wafer. The semiconductor substrate W may have a first surface S1 and a second surface S2 opposite to each other, and the semiconductor substrate grinding apparatus 100 may grind the first surface S1 exposed thereabove. In an example embodiment, the first surface S1 of the semiconductor substrate W may be a back side BS, opposite to a surface on which a device is formed.

The semiconductor substrate W may have a structure in which a first semiconductor substrate W1 and a second semiconductor substrate W2 are stacked, and a first device layer DL1, a bonding layer BL, and a second device layer DL2, may be stacked between the first semiconductor substrate W1 and the second semiconductor substrate W2.

The semiconductor substrate W may be loaded an upper surface of the chuck table 110 so that the back side BS of the semiconductor substrate W faces upwardly. The chuck table 110 may rotate the semiconductor substrate W in one direction D1. In an example embodiment, one direction may be a counterclockwise direction. The chuck table 110 may rotate at a constant rotational speed. The grinding wheel 120 and the polishing wheel 130 may perform a grinding process and a polishing process, respectively, by dividing a region on the back side BS of the semiconductor substrate W.

The grinding wheel 120 may be disposed above the chuck table 110 to overlap the first region AR1 of the semiconductor substrate W. The first region AR1 is a region extending from an edge of the semiconductor substrate W toward a center thereof, and may be defined as a region, not including the center of the semiconductor substrate W. That is, the grinding wheel 120 may be disposed to cover a partial region including the edge of the back side BS of the semiconductor substrate W. In addition, the grinding wheel 120 may be disposed to partially overlap the chuck table 110.

Referring to FIG. 2B, the grinding wheel 120 may include a disc-shaped grinding wheel body 121, a wheel blade 122 disposed on a lower surface of the disc-shaped grinding wheel body 121, and a grinding wheel rotating shaft 123 coupled to an upper surface of the disc-shaped grinding wheel body 121. The grinding wheel 120 may grind a back side BS of the semiconductor substrate W by rotating while applying a constant load to the back side B of the semiconductor substrate W. Grinding may be defined as a process of reducing a thickness of the semiconductor substrate W, by roughly abrading the surface of the semiconductor substrate W.

The disc-shaped grinding wheel body 121 may rotate at a constant rotational speed by rotation of the grinding wheel rotating shaft 123. The disc-shaped grinding wheel body 121 may rotate in the same direction as the one direction D1 in which the chuck table 110 rotates. For example, the disc-shaped grinding wheel body 121 may rotate in a counter-clockwise direction in which the chuck table 110 rotates. According to an example embodiment, the disc-shaped grinding wheel body 121 may perform a translational motion or may move up and down by the grinding wheel rotating shaft 123.

The wheel blade 122 may be in contact with a back side BS of the semiconductor substrate W, to directly grind the back side BS of the semiconductor substrate W. The wheel blade 122 may grind the back side BS of the semiconductor substrate W, to reduce a thickness of the semiconductor substrate W. In this process, by-products ABP crushed by the wheel blade 122 may remain on the back side BS of the semiconductor substrate W. The wheel blade 122 may be formed in a circular ring shape disposed along an edge of the disc-shaped grinding wheel body 121, but an example embodiment thereof is not limited thereto, and the wheel blade 122 may be deformed in various shapes. The wheel blade 122 may be formed of a diamond material. For example, the wheel blade 122 may be formed by sintering an abrasive such as diamond particles, a resin, and the like.

The cleaning liquid supply unit 140 may be disposed above the chuck table 110 to be spaced apart from the grinding wheel 120 in one direction D1. That is, the cleaning liquid supply unit 140 may be disposed between the grinding wheel 120 and the slurry supply unit 150. In addition, it may be understood that the cleaning liquid supply unit 140 is disposed at a front end of the slurry supply unit 150 in one direction D. The cleaning liquid supply unit 140 may spray a cleaning liquid CL onto the back side BS of the semiconductor substrate W, to clean by-products ABP generated in a process in which the grinding wheel 120 grinds the semiconductor substrate W. The cleaning liquid CL may be de-ionized water. However, an example embodiment of the disclosure is not limited thereto, and various types of cleaning liquids may be used. For example, a mixture of ammonia and hydrogen peroxide may be used as the cleaning liquid CL.

Figure 3A:
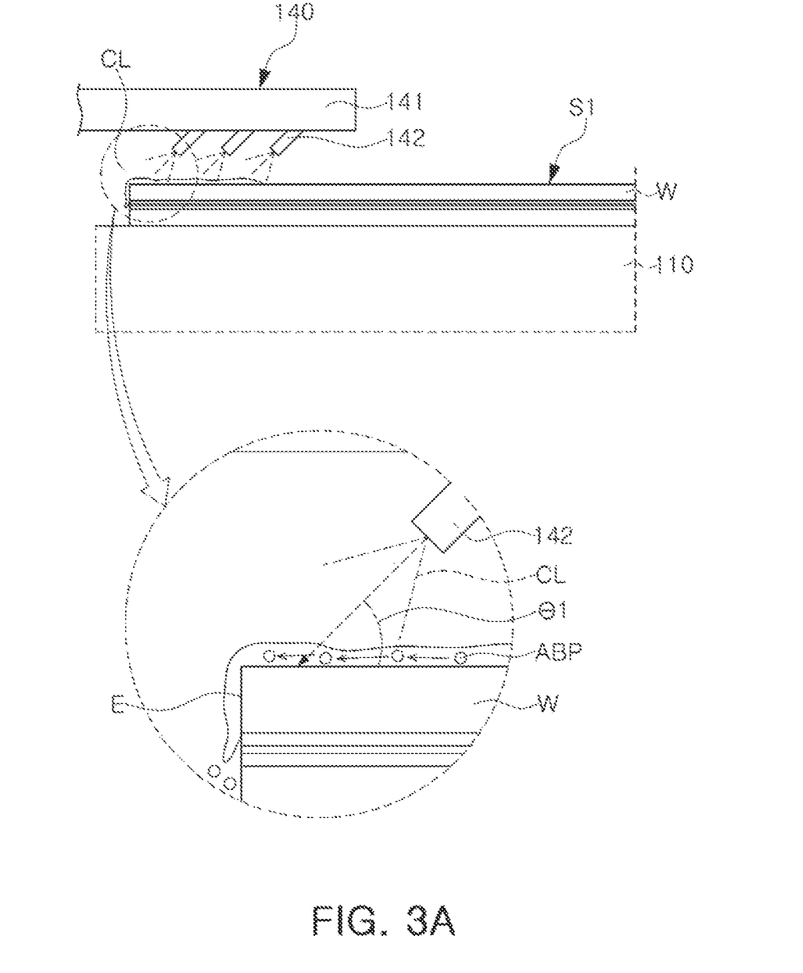
FIG. 3A is a side view of a cleaning liquid supply unit, according to an embodiment.

Referring to FIG. 2B, the cleaning liquid supply unit 140 may include a cleaning liquid supply unit body 141, extending to an upper portion of the semiconductor substrate W, a cleaning liquid spray nozzle 142, at least one cleaning liquid spray nozzle 142 being disposed below the cleaning liquid supply unit body 141, and a cleaning liquid supply source 143. The cleaning liquid CL sprayed from the cleaning liquid spray nozzle 142 may flow toward an edge E of the semiconductor substrate W, together with the by-product ABP by rotation of the chuck table 110. FIG. 3A is a side view of a cleaning liquid supply unit, according to an embodiment. As illustrated in FIG. 3A, the cleaning liquid supply unit 140 may spray the cleaning liquid CL in a direction toward the edge E of the semiconductor substrate W. That is, the cleaning liquid supply unit 140 may spray the cleaning liquid CL toward the edge E of the semiconductor substrate W at an oblique angle $\theta 1$ with respect to the back side BS. Accordingly, the by-product ABP generated on the back side BS of the semiconductor substrate W in the grinding process may be more rapidly removed from the semiconductor substrate W together with the cleaning liquid CL. In addition, the by-product ABP generated in the grinding process of the polishing wheel 130 may flow into a polishing pad 132, thereby preventing the polishing pad 132 from being damaged.

Referring to FIG. 2B, the slurry supply unit 150 may include a slurry supply unit body 151 having an end portion extending to an upper portion of the semiconductor substrate W, a slurry spraying nozzle 152, at least one slurry spraying nozzle 152 being disposed below the slurry supply unit body 151, and a slurry supply source 153.

Figure 3B:
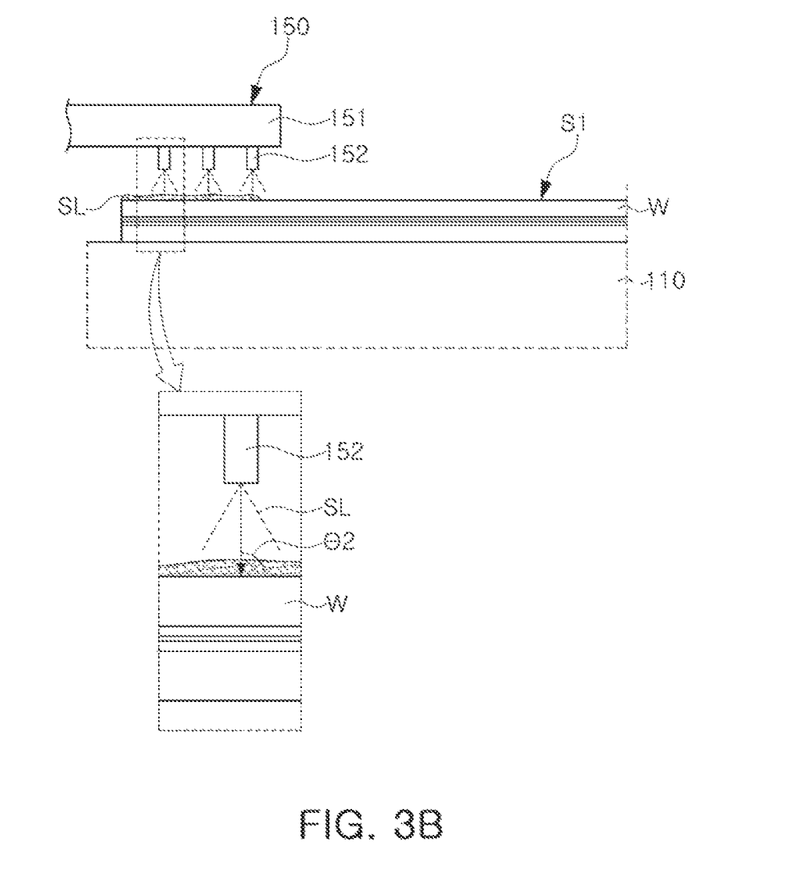
FIG. 3B is a side view of a slurry supply unit, according to an embodiment.

The slurry supply unit 150 may be disposed above the chuck table 110, to be adjacent to the cleaning liquid supply unit 140 in one direction D1. That is, the slurry supply unit 150 may be disposed between the cleaning liquid supply unit 140 and the polishing wheel 130. In addition, it may be understood that the slurry supply unit 150 is disposed at a front end of the polishing wheel 130. The slurry supply unit 150 may supply a slurry SL to a region in which the polishing wheel 130 polishes the semiconductor substrate W. That is, the slurry SL supplied from the slurry supply unit 150 may be used to polish a back side BS of the semiconductor substrate W by the polishing wheel 130. FIG. 3B is a side view of a slurry supply unit, according to an embodiment. As illustrated in FIG. 3B, the slurry supply unit 150 may spray the slurry SL in a normal direction, an angle θ2, perpendicular to the back side BS of the semiconductor substrate W. According to an example embodiment, the slurry supply unit 150 may spray the slurry SL in a heated or cooled state. The slurry SL supplied from the slurry supply unit 150 may include abrasive powder finer than the abrasive grains included in the wheel blade 122 of the grinding wheel 120. The slurry SL sprayed on the back side BS of the semiconductor substrate W from the slurry supply unit 150 may flow into a second region AR2 in which a polishing wheel 130 is disposed by rotation of the chuck table 110, for performing chemical mechanical polishing on the back side BS of the semiconductor substrate W.

The polishing wheel 130 may be disposed above the chuck table 110, between the slurry supply unit 150 and the grinding wheel 120 in one direction D1. In addition, the polishing wheel 130 may be disposed above the chuck table 110 to be spaced apart from the grinding wheel 120 in one direction D1. The polishing wheel 130 may be disposed to cover a second region AR2, spaced apart from the first region AR1 in which the grinding wheel 120 performs a grinding process, to perform a polishing process in the second region AR2. Accordingly, the polishing process may be simultaneously performed in-situ in the same facility as the grinding process.

The polishing wheel 130 may include a disk-shaped polishing wheel body 131, a polishing pad 132 coupled to a lower surface of the disk-shaped polishing wheel body 131, and a polishing wheel rotating shaft 133 coupled to an upper surface of the disk-shaped polishing wheel body 131. The polishing wheel 130 may polish a back side BS of the semiconductor substrate W by rotating while applying a constant load to the back side BS of the semiconductor substrate W. Polishing is a process of changing a surface state of the semiconductor substrate W by finely abrading the surface of the semiconductor substrate W, and may be chemical mechanical polishing.

The disk-shaped polishing wheel body 131 may rotate at a constant rotational speed by rotation of a polishing wheel rotating shaft 133. The disk-shaped polishing wheel body 131 may rotate in the same direction as one direction D1, in which the chuck table 110 rotates. For example, the disk-shaped polishing wheel body 131 may rotate in a counter-clockwise direction in a direction in which the chuck table 110 rotates. According to an example embodiment, the disk-shaped polishing wheel body 131 may perform a translational motion or may move up and down by the polishing wheel rotating shaft 133.

The polishing wheel rotating shaft 133 may be disposed parallel to the grinding wheel rotating shaft 123. However, the disclosure is not limited thereto, and as will be described later, the polishing wheel rotating shaft 133 may be disposed to be perpendicular to the grinding wheel rotating shaft 123, to be parallel to the back side BS of the semiconductor substrate W.

The polishing pad 132 may be disposed on a lower surface of the polishing wheel 130. The polishing pad 132 may have a disk shape, and a diameter DM2 of the polishing pad 132 may be equal to or smaller than a diameter DM1 of the grinding wheel 120. However, the disclosure is not limited thereto, and may be deformed into various shapes such as a cylindrical shape. The polishing pad 132 may be formed of a non-woven material. For example, the polishing pad 132 may be formed by compressing polyethylene fibers, or the like with a polymer. The polishing pad 132 does not itself have a polishing function like the wheel blade 122 of the grinding wheel 120, but has a polishing function by a slurry SL supplied through the slurry supply unit 150.

The polishing wheel 130 may prevent damage to a semiconductor substrate W, by polishing a back side BS of the semiconductor substrate W using a slurry SL supplied from the slurry supply unit 150. When a surface of the semiconductor substrate W is repeatedly grinded, cracks are accumulated on the surface of the semiconductor substrate W, and there may be a problem in that the semiconductor substrate W is transferred to first and second device layers DL1 and DL2, or the semiconductor substrate W is broken. In the semiconductor substrate grinding apparatus 100 of an example embodiment, since grinding and polishing are simultaneously performed in the grinding wheel 120 and the polishing wheel 130, cracks in the semiconductor substrate W generated in the grinding process can be removed in the polishing process. Accordingly, the cracks generated on the surface of the semiconductor substrate W are deepened and transferred to the first and second device layers DL1 and DL2 or a phenomenon, in which the semiconductor substrate W is broken is reduced, thereby preventing the semiconductor substrate W from being damaged.

Figure 4:
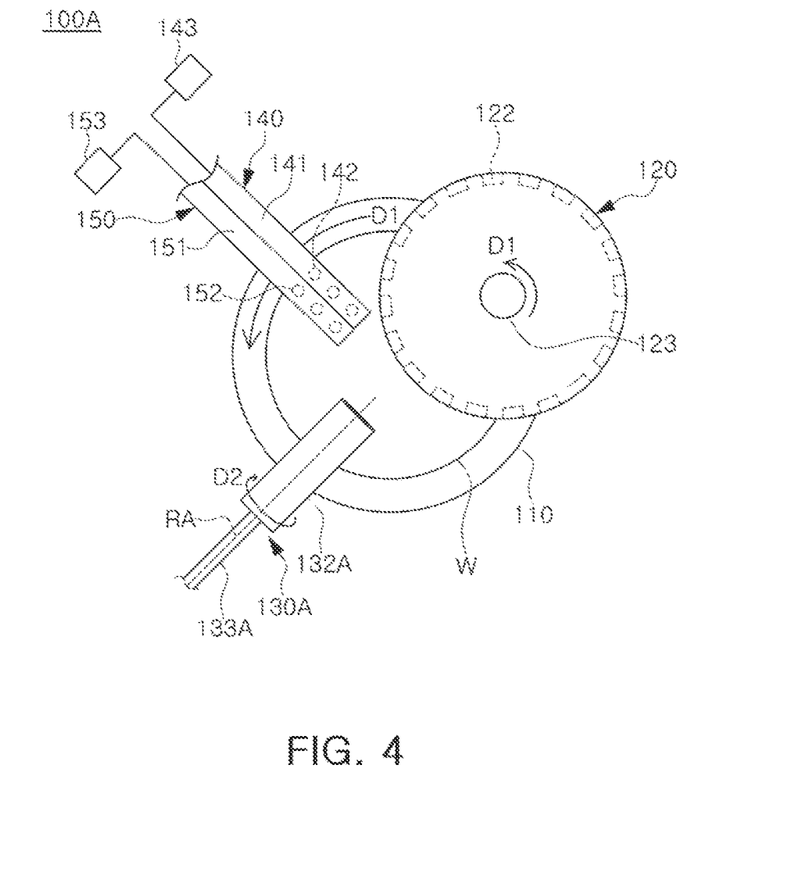
FIG. 4 is a view of a semiconductor substrate grinding apparatus, according to an embodiment.

Hereinafter, various embodiments of the semiconductor substrate grinding apparatus will be described with reference to FIGS. 4 and 5. FIG. 4 is a view of a semiconductor substrate grinding apparatus, according to an embodiment; and FIG. 5 is view of a semiconductor substrate grinding apparatus, according to an embodiment.

Referring to FIG. 4, there is a difference in that a semiconductor substrate grinding apparatus 100A according to an example embodiment has a different shape of a polishing wheel 130A, as compared with the semiconductor substrate grinding apparatus 100 according to the above-described example embodiment. Since other configurations are the same as those of the above-described example embodiment, detailed descriptions thereof will be omitted in order to prevent overlapping descriptions.

The polishing wheel 130A of the semiconductor substrate grinding apparatus 100A according to an example embodiment may be perpendicular to a grinding wheel rotating shaft 123 such that a rotation axis RA is parallel to an upper surface of the semiconductor substrate W. A cylindrical polishing pad 132A may be disposed at an end of the polishing wheel 130A. The cylindrical polishing pad 132A may rotate to have the same rotation direction D2 at a point in contact with a back side BS of the semiconductor substrate W. In an example embodiment, the polishing pad 132 may be formed in a cylindrical shape, to be disposed in a narrower space, as compared to the above-described example embodiment.

Figure 5:
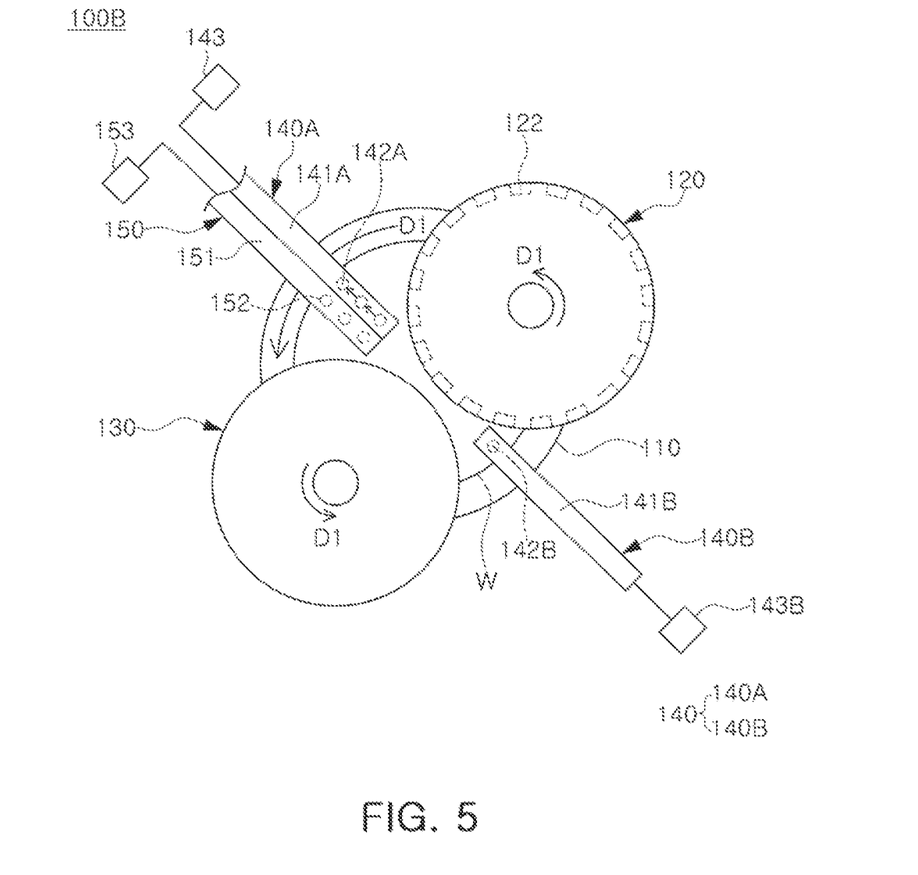
FIG. 5 is view of a semiconductor substrate grinding apparatus, according to an embodiment.

Referring to FIG. 5, a semiconductor substrate grinding apparatus 100B according to an example embodiment has a difference in that a plurality of cleaning liquid supply units 140 are provided, as compared to the semiconductor substrate grinding apparatus 100 according to the above-described example embodiment. Since other configurations are the same as those of the above-described example embodiment, detailed descriptions thereof will be omitted in order to prevent overlapping descriptions. The cleaning liquid supply unit 140 may include a first cleaning liquid supply unit 140A and a second cleaning liquid supply unit 140B. Each of the first cleaning liquid supply unit 140A and the second cleaning liquid supply unit 140B may include first and second cleaning liquid supply unit bodies 141A and 141B and first and second cleaning liquid supply nozzles 142A and 142B, and first and second cleaning liquid supply sources 143A and 143B. The first cleaning liquid supply unit 140A may be disposed between the grinding wheel 120 and the slurry supply unit 150, in the same manner as the cleaning liquid supply unit 140 of the above-described example embodiment. The second cleaning liquid supply unit 140B may be disposed between a polishing wheel 130 and a grinding wheel 120 based on one direction D1. That is, the second cleaning liquid supply unit 140B may be disposed at a rear end of the polishing wheel 130 based on one direction D1. Accordingly, by-products generated on a back side BS of the semiconductor substrate W in a process of performing a polishing process on a polishing pad 132 may be prevented from flowing into the grinding wheel 120.

Next, a semiconductor substrate grinding method will be described using the semiconductor substrate grinding apparatus 100 according to an example embodiment will be described. The semiconductor substrate grinding method according to an example embodiment may be understood as a process of grinding a semiconductor substrate W using the semiconductor substrate grinding apparatus 100 of FIG. 1. A description of the content overlapping with the content previously described in the semiconductor substrate grinding apparatus 100 will be omitted.

First, a semiconductor substrate W may be loaded on an upper surface of the chuck table 110 so that a back side of the semiconductor substrate W faces upwardly.

Next, the semiconductor substrate W may be rotated in one direction D1. In this case, the semiconductor substrate W may be rotated at a constant rotational speed.

Next, while a grinding process is performed in a first region AR1 of the back side BS of the semiconductor substrate, a polishing process may be performed in a second region AR2, spaced apart from the first region AR1 of the semiconductor substrate W. In this case, a cleaning liquid CL and a slurry SL may be sprayed between the first region AR1 and the second region AR2. Specifically, based on one direction D1, a cleaning liquid supply unit 140 through which the cleaning liquid CL is sprayed may be disposed at a rear end of the grinding wheel 120 on which a grinding process is performed, so that the cleaning liquid CL is sprayed onto the semiconductor substrate W after the grinding process is performed, based on one direction. A slurry supply unit 150 to which the slurry SL is sprayed may be disposed at a rear end of the cleaning liquid supply unit 140. Accordingly, on the semiconductor substrate W, the grinding process and the polishing process may be simultaneously performed.

Next, the semiconductor substrate W may be unloaded from the chuck table 110.

As set forth above, in a semiconductor substrate grinding apparatus according to the technical idea of the disclosure, damages to a semiconductor substrate may be prevented by simultaneously performing a polishing process in the process of grinding the semiconductor substrate.

In a semiconductor substrate grinding method according to the technical idea of the disclosure, damages to a semiconductor substrate may be prevented by simultaneously performing a polishing process in the process of grinding the semiconductor substrate.

Herein, a lower side, a lower portion, a lower surface, and the like, are used to refer to a direction toward a mounting surface of the fan-out semiconductor package in relation to cross-sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

The various and advantageous advantages and effects of the disclosure are not limited to the above description, and may be more easily understood in the course of describing the specific embodiments of the disclosure.

While example embodiments have been shown and described above, it will be apparent to those skilled in the art that modifications and variations could be made without departing from the scope of the disclosure as defined by the appended claims and their equivalents.

What is claimed is:

1. A semiconductor substrate grinding apparatus, comprising:
    a chuck table configured to mount a semiconductor substrate and fix the semiconductor substrate thereto, so that a back side of the semiconductor substrate faces upwardly and rotates in one direction;
    a grinding wheel above the chuck table, and configured to grind the back side of the semiconductor substrate;
    a cleaning liquid supplier above the chuck table, spaced apart from the grinding wheel in the one direction, and configured to supply a cleaning liquid to the back side of the semiconductor substrate for cleaning by-products generated by grinding the semiconductor substrate;

a slurry supplier above the chuck table, adjacent to the cleaning liquid supplier in the one direction, and configured to supply a slurry to the back side of the semiconductor substrate;

a polishing wheel above the chuck table, spaced apart from the slurry supplier in the one direction, and configured to perform chemical mechanical polishing on the back side of the semiconductor substrate using the slurry, and an additional cleaning liquid supplier above the chuck table, wherein the cleaning liquid supplier is configured to spray the cleaning liquid toward an edge of the semiconductor substrate at an oblique angle with respect to the back side of the semiconductor substrate, wherein the cleaning liquid supplier comprises:
 a cleaning liquid supply unit body that extends in a second direction, that crosses the one direction, to above the chuck table; and
 at least one cleaning liquid spray nozzle on a bottom side of the cleaning liquid supply unit body, the at least one cleaning liquid spray nozzle configured to receive the cleaning liquid from the cleaning liquid supply unit body, and spray the cleaning liquid toward the edge of the semiconductor substrate at the oblique angle, and wherein the additional cleaning liquid supplier comprises:
 an additional cleaning liquid supply unit body that extends in a third direction, that is opposite to the second direction, to above the chuck table; and
 an additional cleaning liquid spray nozzle on a bottom side of the additional cleaning liquid supply unit body, the additional cleaning liquid spray nozzle configured to receive the cleaning liquid from the additional cleaning liquid supply unit body, and spray the cleaning liquid toward the semiconductor substrate.

2. The semiconductor substrate grinding apparatus of claim 1, wherein the polishing wheel comprises:
a disc-shaped polishing wheel body;
a polishing wheel rotating shaft connected to an upper surface of the disc-shaped polishing wheel body; and
a polishing pad connected to a lower surface of the disc-shaped polishing wheel body, and disposed toward the back side of the semiconductor substrate.

3. The semiconductor substrate grinding apparatus of claim 2, wherein the grinding wheel comprises:
a disc-shaped grinding wheel body;
a grinding wheel rotating shaft connected to an upper surface of the disc-shaped grinding wheel body; and
a ring-shaped wheel blade on a lower surface of the grinding wheel.

4. The semiconductor substrate grinding apparatus of claim 3, wherein the polishing pad comprises a different material from that of the ring-shaped wheel blade.

5. The semiconductor substrate grinding apparatus of claim 4, wherein the polishing pad is made of a non-woven material, and wherein the ring-shaped wheel blade comprise a diamond material.

6. The semiconductor substrate grinding apparatus of claim 3, wherein rotational speed of the polishing wheel rotating shaft is different from rotational speed of the grinding wheel rotating shaft.

7. The semiconductor substrate grinding apparatus of claim 3, wherein a diameter of the polishing wheel is equal to or smaller than a diameter of the grinding wheel.

8. The semiconductor substrate grinding apparatus of claim 1, wherein the polishing wheel comprises:
a polishing wheel rotating shaft above the chuck table, parallel to the back side of the semiconductor substrate; and
a cylindrical polishing pad connected to the polishing wheel rotating shaft, and disposed toward the back side of the semiconductor substrate.

9. The semiconductor substrate grinding apparatus of claim 1, wherein the polishing wheel rotates in a same direction as the grinding wheel, the same direction being the one direction.

10. The semiconductor substrate grinding apparatus of claim 1, wherein the grinding wheel is configured to grind a first region of the semiconductor substrate,
wherein the polishing wheel is configured to perform chemical mechanical polishing of a second region of the semiconductor substrate, while the grinding wheel grinds the first region of the semiconductor substrate, and
wherein the first region and the second region are non-overlapping with respect to each other.

11. The semiconductor substrate grinding apparatus of claim 1, wherein the slurry supplier is configured to spray the slurry toward the semiconductor substrate at an angle, with respect to the back side of the semiconductor substrate, that is different from the oblique angle.

12. The semiconductor substrate grinding apparatus of claim 1, wherein the slurry supplier is configured to spray the slurry toward the semiconductor substrate in a direction perpendicular to the back side of the semiconductor substrate.

13. The semiconductor substrate grinding apparatus of claim 1, wherein the slurry supplier comprises:
a slurry supply unit body that extends in the second direction to above the chuck table; and
at least one slurry spray nozzle on a bottom side of the slurry supply unit body, the at least one slurry spray nozzle configured to receive the slurry from the slurry supply unit body, and spray the slurry to the back side of the semiconductor substrate.

14. The semiconductor substrate grinding apparatus of claim 13, wherein the at least one cleaning liquid spray nozzle of the cleaning liquid supplier comprises a plurality of nozzles, wherein the plurality of nozzles are tilted at the oblique angle such as to be configured to spray the cleaning liquid toward the edge of the semiconductor substrate at the oblique angle.

15. A semiconductor substrate grinding apparatus, comprising:
a chuck table configured to mount a semiconductor substrate and fix the semiconductor substrate thereto, so that a back side of the semiconductor substrate faces upwardly and rotates in one direction;
a grinding wheel above the chuck table, and configured to grind the back side of the semiconductor substrate;
a polishing wheel above the chuck table, spaced apart in the one direction and from the grinding wheel, and configured to polish the back side of the semiconductor substrate;
a cleaning liquid supplier above the chuck table, between the grinding wheel and the polishing wheel based on the one direction, and configured to supply a cleaning liquid to the back side of the semiconductor substrate;

a slurry supplier above the chuck table, between the cleaning liquid supplier and the polishing wheel based on the one direction, and configured to supply a slurry to the back side of the semiconductor substrate, and an additional cleaning liquid supplier above the chuck table, wherein the cleaning liquid supplier is configured to spray the cleaning liquid toward an edge of the semiconductor substrate at an oblique angle with respect to the back side of the semiconductor substrate, wherein the cleaning liquid supplier comprises:
- a cleaning liquid supply unit body that extends in a second direction, that crosses the one direction, to above the chuck table; and
- at least one cleaning liquid spray nozzle on a bottom side of the cleaning liquid supply unit body, the at least one cleaning liquid spray nozzle configured to receive the cleaning liquid from the cleaning liquid supply unit body, and spray the cleaning liquid toward the edge of the semiconductor substrate at the oblique angle, and wherein the additional cleaning liquid supplier comprises:
- an additional cleaning liquid supply unit body that extends in a third direction, that is opposite to the second direction, to above the chuck table; and
- an additional cleaning liquid spray nozzle on a bottom side of the additional cleaning liquid supply unit body, the additional cleaning liquid spray nozzle configured to receive the cleaning liquid from the additional cleaning liquid supply unit body, and spray the cleaning liquid toward the semiconductor substrate.

16. The semiconductor substrate grinding apparatus of claim 15, wherein the polishing wheel is configured to perform chemical mechanical polishing on the back side of the semiconductor substrate using the slurry.

17. The semiconductor substrate grinding apparatus of claim 15, wherein the polishing wheel comprises:
- a disc-shaped polishing wheel body;
- a polishing wheel rotating shaft connected to an upper surface of the disc-shaped polishing wheel body; and
- a polishing pad connected to a lower surface of the disc-shaped polishing wheel body, and disposed toward the back side of the semiconductor substrate.

18. The semiconductor substrate grinding apparatus of claim 17, wherein the grinding wheel comprises:
- a disc-shaped grinding wheel body;
- a grinding wheel rotating shaft connected to an upper surface of the disc-shaped grinding wheel body; and
- a ring-shaped wheel blade disposed on a lower surface of the grinding wheel.

19. The semiconductor substrate grinding apparatus of claim 18, wherein the polishing pad comprises a different material from that of the ring-shaped wheel blade.

20. A semiconductor substrate grinding apparatus, comprising:
- a chuck table configured to mount a semiconductor substrate and fix the semiconductor substrate thereto, so that a back side of the semiconductor substrate faces upwardly and rotates in one direction;
- a grinding wheel above the chuck table, to overlap a first region of the semiconductor substrate, and configured to perform a first process of reducing a thickness of the semiconductor substrate by grinding the back side of the semiconductor substrate; and
- a polishing wheel above the chuck table, to overlap a second region of the semiconductor substrate, spaced apart from the first region of the semiconductor substrate, and configured to perform a second process of polishing the back side of the semiconductor substrate that is ground by the grinding wheel;
- a cleaning liquid supplier configured to supply a cleaning liquid to the back side of the semiconductor substrate, wherein the cleaning liquid supplier is disposed between the grinding wheel and the polishing wheel, and
- an additional cleaning liquid supplier above the chuck table, wherein the grinding wheel and the polishing wheel are configured to simultaneously perform the first process and the second process, respectively, wherein the cleaning liquid supplier is configured to spray the cleaning liquid toward an edge of the semiconductor substrate at an oblique angle with respect to the back side of the semiconductor substrate, wherein the cleaning liquid supplier comprises:
- a cleaning liquid supply unit body that extends in a second direction, that crosses the one direction, to above the chuck table; and
- at least one cleaning liquid spray nozzle on a bottom side of the cleaning liquid supply unit body, the at least one cleaning liquid spray nozzle configured to receive the cleaning liquid from the cleaning liquid supply unit body, and spray the cleaning liquid toward the edge of the semiconductor substrate at the oblique angle, and wherein the additional cleaning liquid supplier comprises:
- an additional cleaning liquid supply unit body that extends in a third direction, that is opposite to the second direction, to above the chuck table; and
- an additional cleaning liquid spray nozzle on a bottom side of the additional cleaning liquid supply unit body, the additional cleaning liquid spray nozzle configured to receive the cleaning liquid from the additional cleaning liquid supply unit body, and spray the cleaning liquid toward the semiconductor substrate.

21. The semiconductor substrate grinding apparatus of claim 20, wherein the cleaning liquid supplier comprises:
- a first cleaning liquid supplier; and
- a second cleaning liquid supplier, wherein the first cleaning liquid supplier is at a rear end of the grinding wheel based on the one direction, and the second cleaning liquid supplier is at a rear end of the polishing wheel based on the one direction.

22. The semiconductor substrate grinding apparatus of claim 20, further comprising:
- a slurry supplier above the chuck table, between the cleaning liquid supplier and the polishing wheel, based on the one direction, and configured to supply a slurry to the back side of the semiconductor substrate.

* * * * *